United States Patent
Tsuji et al.

(10) Patent No.: US 6,808,744 B2
(45) Date of Patent: Oct. 26, 2004

(54) METHOD FOR PREPARING AND REGENERATING A COMPOSITE CRUCIBLE

(75) Inventors: Yoshiyuki Tsuji, Akita (JP); Masanori Fukui, Akita (JP); Ken-ichi Hiroshima, Akita (JP)

(73) Assignee: Mitsubishi Material Quartz Corporation (JP)

( * ) Notice: Subject to any disclaimer, the term of this patent is extended or adjusted under 35 U.S.C. 154(b) by 78 days.

(21) Appl. No.: 10/352,654

(22) Filed: Jan. 28, 2003

(65) Prior Publication Data

US 2003/0113449 A1 Jun. 19, 2003

Related U.S. Application Data

(62) Division of application No. 09/334,239, filed on Jun. 16, 1999, now Pat. No. 6,524,668.

(30) Foreign Application Priority Data

Jun. 18, 1998 (JP) ............................................. 10-170809

(51) Int. Cl.[7] .................................................. B05D 7/22
(52) U.S. Cl. ........................ 427/183; 427/181; 427/193; 427/376.2; 427/397.7; 427/350; 427/294; 264/112; 264/114; 264/102; 264/311; 65/33.6; 65/36
(58) Field of Search ................................. 427/181, 183, 427/193, 376.2, 397.7, 350, 294; 264/112, 114, 311, 102; 65/33.1, 33.5, 33.6, 33.9, 36

(56) References Cited

U.S. PATENT DOCUMENTS

| | | | | |
|---|---|---|---|---|
| 5,800,924 A | * | 9/1998 | Metter | ........................ 428/408 |
| 5,922,127 A | | 7/1999 | Luter et al. | |
| 5,954,875 A | | 9/1999 | Kato et al. | |
| 5,972,488 A | | 10/1999 | Nagata et al. | |

FOREIGN PATENT DOCUMENTS

| | | | |
|---|---|---|---|
| DE | 3835646 A1 | | 6/1989 |
| GB | 816334 | * | 7/1959 |
| JP | 02 188489 A | | 7/1990 |
| JP | 04 021586 A | | 1/1992 |
| JP | 09 020586 A | | 1/1997 |
| JP | 09 263482 A | | 10/1997 |

* cited by examiner

*Primary Examiner*—Harold Pyon
*Assistant Examiner*—Michael C. Miggins
(74) *Attorney, Agent, or Firm*—Webb Ziesenheim Logsdon Orkin & Hanson, P.C.

(57) ABSTRACT

A composite crucible for pulling up monocrystalline silicon, which is superior in shape stability and suitable for a large-sized one is provided. The composite crucible is characterized in that a carbonaceous material as an outer layer and a quartz glass as an inner layer are integrally formed. Methods for preparing and regenerating a composite crucible are also disclosed.

5 Claims, 1 Drawing Sheet

METHOD FOR PREPARING AND REGENERATING A COMPOSITE CRUCIBLE

CROSS REFERENCE TO RELATED APPLICATIONS

This application is a divisional of U.S. patent application Ser. No. 09/334,239, filed Jun. 16, 1999, now U.S. Pat. No. 6,524,688 B1, which is herein incorporated by reference in its entirety.

BACKGROUND OF THE INVENTION

1. Field of the Invention

The present invention relates to a composite crucible to be used for pulling up monocrystalline silicon (single crystal silicon). More specifically, the present invention relates to a composite crucible having superior thermal resistance suitable for pulling up large-size monocrystalline silicon in which a quartz glass as an inner layer and a carbonaceous material as an outer layer are integrated to from a composite structure, and to a preparation method and a regeneration method thereof.

2. Description of the Prior Art

Monocrystalline silicon, namely, single crystal silicon for semiconductor materials are prepared generally by Czochralski method with which monocrystalline silicon is pulled up from a molten polycrystalline silicon. In the method, a quartz glass crucible is used as a material for a vessel for holding the molten polycrystalline silicon therein.

Recently, there has been required a large-size crucible in accordance with requirements of large-sized wafers. As to the large-size crucible for pulling up large size monocrystalline silicon, the period for pulling up monocrystalline silicon becomes longer than that in the conventional ones. In addition, it is used at a higher temperature than the conventional one, thus particularly, thermal resistance strength thereof becomes a problem. Then, there may be considered a counter measure to increase strength by thickening a glass crucible, but the thickness of the glass crucible is limited due to its production procedure. Thus, if a large-size tendency is proceeded more, mechanical strength will become insufficient in the conventional structural ones, which causes deformation of the crucible when used at a high temperature, or which may cause a fracture in being handled.

Generally, the quartz glass crucible is used by fitting to a crucible-form susceptor that is, an outer crucible mounted on a pulling machine. This susceptor is made of carbon. Carbon is used as a thermal resistant material having a high thermal conductivity. However, since there are some partial gaps between the quartz glass crucible and the carbon susceptor to produce loose fitness thereof in the conventional ones, some problems such as swelling, inside falling over or sinking down of the quartz glass crucible wall may be caused. Further, if fitness between the quartz glass crucible and the carbon susceptor being poor, a coefficient of thermal conductivity is lowered and conduction of heat becomes ununiform.

Further, the crucible itself is required to be large in size for pulling up large monocrystalline silicon, which is in turn inevitably accompanied with a large-size carbon susceptor. Thus, in order to make assembly thereof easy, a divided type one has been used. Such divided type susceptor has such a problem that gaps are formed at seams, which causes fracture of the quartz glass crucible, or the like.

Further, since the quartz glass crucible should be fitted to the carbon susceptor every time when used in the conventional method, the operation thereof is troublesome and also contamination may be easily produced at a contacting face of the quartz glass crucible and the carbon susceptor, which may cause conduction of heat ununiform.

On the other hand, there have been proposed several susceptors in which the conventional graphite material is substituted with carbon fiber reinforced carbon (Japanese Patent Application Laid-Open No. Hei 09-263482, etc.) as the improved carbon susceptors. These susceptors have similar problems to the above-mentioned ones, since they are structured as separate bodies from the quartz glass crucibles and they are used after being fitted to the quartz glass crucible.

SUMMARY OF THE INVENTION

The present invention has been made to overcome the above-mentioned problems inherent in the conventional quartz glass crucibles, and therefore has an object of the invention to provide a crucible for pulling up monocrystalline silicon with high reliability, and to a preparation method and a regeneration method thereof, in which the crucible has superior mechanical strength, thus it is suitable as a large-size crucible without any deformation when used at a high temperature, and any problem due to insufficient adhesion between the susceptor and the quartz glass crucible is not present, since the conventional carbon susceptor is not necessarily used, thus a high single crystallization yield can be attained.

That is, the present invention relates to a composite crucible for pulling up monocrystalline silicon, comprising an inner layer made of quartz glass and an outer layer made of a carbonaceous material, wherein that the carbonaceous material in the outer layer and the quartz glass in the inner layer are integrally formed.

As preferred embodiments of the present invention, the composite crucible according to the present invention includes (I) one in which the outer layer comprises a laminate of a carbon fiber, (II) one in which the outer layer is made of carbon fibers having an average roughness of a surface, which contacts with a quartz glass in the inner layer, of 0.1–1.0 mm and an average distance between concave and convex parts of 0.2~5 mm, and (III) one in which the outer layer comprises a laminate of carbon fibers having a gas permeability of 0.5 cm/sec or more.

Also, the present invention relates to a method for preparing a composite crucible for pulling up monocrystalline silicon, which crucible having an inner quartz layer and an outer carbonaceous material layer, the method being characterized by comprising: using a carbon fiber crucible as an outer circumferential part, supplying quartz powders on an inner surface of the carbon crucible while rotating it to be heated and melted; and vitrifying the quartz layer up to the inner surface of the carbon crucible to integrally form the quartz glass layer and the carbon crucible layer, thereby obtaining the composite crucible having a carbon fiber outer layer integrally formed with a quartz glass inner layer.

The preparation method as to said method comprising the steps of: depositing quartz powders on the inner surface of the carbon crucible to be heated and melted; and supplying quartz powders gradually under heating to deposit a melted quartz powder on the quartz layer, thereby obtaining a composite crucible having a transparent glass layer formed in the inner surface thereof.

Further, the preparation method as to said method comprising the steps of: using a carbon fiber crucible having gas permeability as an outer circumferential part; depositing quartz powders on an inner surface of the carbon crucible while rotating it to be heated and fused; reducing the pressure in the crucible through the carbon crucible upon the heating and fusing; sucking and removing the gas contained in the quartz layer; and extruding bubbles contained in the quartz glass layer to form a transparent glass layer on an inner surface of the carbon crucible, thereby obtaining the composite crucible in which the quartz glass layer and the carbon crucible layer are integrally formed.

Further, the present invention relates to a method for regenerating a composite crucible, comprising: heating the crucible from an inner surface side and fusing again a surface of a quartz glass layer, and to a method for regenerating a composite crucible, comprising: removing a quartz glass layer of the composite crucible; supplying fresh quartz powders on an inner surface of the remaining carbon crucible to be heated and fused; and vitrifying the quartz powders to thereby integrally form the quartz glass layer and carbon crucible layer.

DETAILED DESCRIPTION OF THE PRESENT INVENTION

Figure 1:
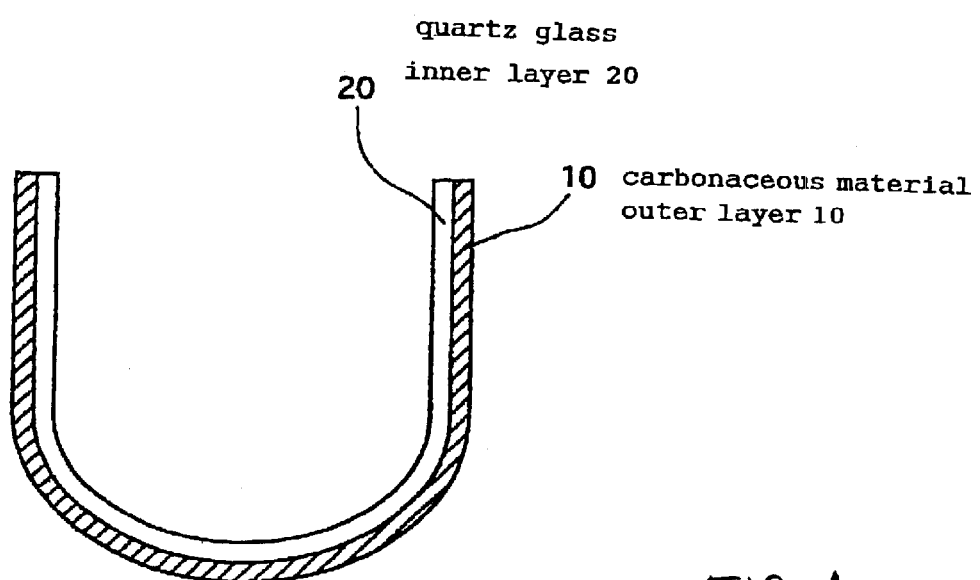
FIG. 1 is a longitudinal cross-sectional schematic view showing a composite crucible according to the present invention.

The present invention is described concretely with reference to a constituting example illustrated in the drawing.
(I) Composite Crucible FIG. 1 is a longitudinal cross-sectional schematic view showing a composite crucible according to the present invention. The composite crucible according to the present invention is a crucible used for pulling up monocrystalline silicon which comprises a carbonaceous material as an outer layer 10 and a quartz glass as an inner layer 20 integrally formed with the carbonaceous material layer 10.

The carbonaceous material forming the outer layer of the composite crucible according to the present invention means a solid carbon material such as graphite and carbon fiber. The carbonaceous material is superior in thermal resistance and has material strength at a high temperature. Therefore, a composite crucible with superior shape stability at a high temperature can be obtained by forming the outer layer of the crucible with carbonaceous material. Therefore, it is unnecessary to use the conventional carbon susceptor. Further, the thickness of the carbonaceous material to form the outer layer is not limited. It may be any thickness if it is sufficient for maintaining strength of the crucible when used at a high temperature.

As the above-mentioned carbonaceous material, there can be used graphite material molded in a crucible shape, but it is preferable to use laminated carbon fibers or the like molded in a crucible shape. For example, carbon fiber reinforced carbon (CFRC, C—C composite) or the like is preferable in which carbon fibers are blended into matrix carbon or carbon fibers, then hardened with carbon. As the carbon fiber reinforced carbons, there are known those prepared by different preparation methods such as a filament winding method and a laminate method with carbon fiber cloth or felt. Any carbon prepared by any method can be used, and any combination thereof may also be used.

Since the above-mentioned CFRC materials, etc. have a low coefficient of thermal expansion close to that of quartz glass, both are not peeled off by change in a temperature. Further, CFRC materials etc. are lighter than pure carbon materials such as graphite, the former ones are superior in strength and abrasion resistance, etc. Therefore, a composite crucible with high strength, light weight and superior abrasion resistance can be obtained without any peeling off between the outer layer and the inner layer, by forming the outer layer from such carbon fiber reinforced carbon. Further, jointing strength can be increased by using a roughly woven cloth at the jointing surface between the outer layer and the inner layer.

In concrete terms, it is appropriate that an average roughness (an arithmetic average roughness) of the surface jointed with the quartz glass of the inner layer being 0.1–1.0 mm and that an average distance of concave and convex parts being 0.2–5 mm. If the surface roughness being so, melted glass can enter among carbon fibers to obtain a composite crucible having high joint strength.

Further, bubbles contained in the melted glass layer to form the inner layer of the crucible can be sucked and removed into the outer layer by reducing pressure via the outer layer of the carbonaceous material during preparation of the crucible by using a carbonaceous material having gas permeability as an outer layer of the composite crucible. Since the above-mentioned carbon fiber reinforced carbon (CFRC) material can have appropriate gas permeability, it is also suitable for such fusing under the reduced pressure. Thus, gas permeability of the fibrous composite carbon material obtained by laminating carbon fibers, impregnating carbon or resinous binder in fibers and sintering integrally can be controlled when the filling amounts of carbon and resin binders being adjusted.

In concrete terms, preferable gas permeability of carbon fibers in the present invention is 0.5 cm/sec or more. Carbonaceous materials having bulk specific gravity of 1.3–1.6 are preferable. Herein, the above-mentioned gas permeability is expressed by a value of gas amount passed through the material (carbon fiber) per unit time ($cm^3/cm^2/sec$=cm/sec), when air pressure of 1 $kg/cm^2$ being applied at 0° C. and 1 atom.

The quartz glass layer in the crucible inner layer can be formed by accumulating quartz powders on the inner circumferential surface of the carbonaceous material in a crucible form (referred to as carbon crucible) at a specified thickness, then heating and fusing to vitrify. Since the surface of the quartz glass layer is contacted with molten silicon, it is preferable to use quartz powders with high purity containing low impurities as possible in order to prevent mixing of impurities into melted silicon. Further, if there are much bubbles in the quartz glass layer at the inner surface side of the crucible, single crystallization of silicon may be prevented during pulling up, which may cause polycrystallization. Thus, it is preferable to remove bubbles near the surface as possible. In order to remove bubbles at the inner surface side of the crucible, there may be used the following methods: (i) to supply quartz powders gradually with heating and make accumulation on the inner surface of the crucible with vitrification; or as described above (ii) to use a gas permeable carbon crucible having an outer layer of the carbon fibers, etc., to reduce the pressure via the outer layer during heating and fusing of quartz powders and to suck gas in the quartz layer and remove off outside.

For the conventional quartz glass crucible, the thickness of the total crucible wall is about 7–15 mm depending on an opening diameter. However, for the quartz glass crucible according to the present invention, the quartz glass layer in the inner layer can be made thinner than that in the conventional one since the outer layer of the quartz glass crucible according to the present invention is made of carbonaceous material with high strength. In concrete terms, the thickness of quartz glass in the inner layer may be lost by about 1 mm or less when monocrystalline silicon being pulled. Therefore, the quartz glass layer may be about 2~40 mm in thickness, which is somewhat thicker than the lost thickness, in order not to expose the outer layer of the carbonaceous material.

The above-mentioned composite crucible according to the present invention is superior in shape stability at a high temperature without any trouble such as deformation of the crucible when used at a high temperature, since the outer layer is formed integrally with the quartz glass layer of the inner layer by means of the carbon material such as carbon fiber reinforced carbon. Further, it is suitable for a large-size crucible, since it is superior in shape stability.

Further, scattering in coefficient of thermal conductivity in the composite crucible according to the present invention is decreased as well as single crystallization rate and quality of single crystal can be increased, since the conventional carbon susceptor is not necessary and the quartz glass layer is fused integrally with carbonaceous material.

Further, the production cost of the crucible can be much decreased, since the quartz glass layer at the inner circumferential side in the crucible can be formed more thinner than that of the conventional one and the quartz glass layer can be regenerated easily.

(II) Preparation Method

For preparing the composite crucible according to the present invention by a rotating molding method, a carbon crucible to form an outer layer can be utilized as a molding mold. That is, quartz powders forming the inner layer are introduced into a rotating carbon crucible that has been made in a crucible form from carbon fibers (CFRC), etc., and maintained at an inner circumferential surface of the carbon crucible with utilizing centrifugal force. Subsequently, it is heated and fused by arc discharge of the like from the inner surface side of the crucible as a heat source to be fused up to the inner surface of the carbon crucible at which quartz powders being contacted and to vitrify. Since the used CFRC material to form the carbon crucible has fine concave and convex parts due to fibers on the surface, vitrified quartz enters into fine gaps on the carbon crucible surface, thus to obtain a composite crucible quartz glass layer and the carbon crucible firmly integrated to each other by cooling of the quartz glass. As described above concretely, it is appropriate that the average roughness being 0.1–1.0 mm and the distance between concave and convex parts being 0.2–5 mm.

In the above-mentioned preparation method with using the carbon crucible made of carbon fibers, the composite crucible having the formed transparent glass layer almost without bubble can be prepared by supplying quartz powders gradually with heating, fusing to vitrify and then accumulating on the inner surface of crucible while the carbon crucible is rotated.

Alternatively, bubbles in the quartz layer can be removed by depositing quartz powders in uniform thickness on the inner surface of the rotating carbon crucible to heat and melt, and reducing the pressure and sucking to remove gas contained in the quartz layer into outside via the carbon crucible. Heating temperature and time, as well as pressure decreasing amount and time can be determined according to the preparation conditions such as the opening diameter of the crucible, quality of quartz powders, accumulation thickness and bubble content rate.

(III) Regenerating Method

Since the outer layer of the above-mentioned composite crucible according to the present invention is made of the carbonaceous material, such as CFRC, the quartz glass part of the inner layer can be easily regenerated. In concrete terms, for example, in the case that there are damages, fine concave and convex parts or cracks or the like on the inner surface of the prepared composite crucible or in the case that the inner surface of the crucible is melted and lost of molten silicon when the used quartz glass crucible loses smoothness of the inner surface, the composite crucible according to the present invention can be regenerated by heating the crucible from its inner surface side to melt again the surface of the quartz glass layer and to embed the damages or cracks on the inner surface with fused glass.

Additionally, the quartz glass layer in the inner layer can be regenerated by substituting it with a fresh one totally. That is, the total quartz glass layer is removed by applying impact on the composite crucible and fresh quartz powders are accumulated on the inner surface of the remaining carbon crucible, heating and fusing it up to the inner surface of the carbon crucible at which quartz powders being contacted. Thereby, it is vitrified, thus the quartz glass layer and the carbon crucible layer are integrated to regenerate the composite crucible.

EXAMPLES

Example 1

Quartz powders were accumulated on an inner surface of a rotating carbon crucible made of carbon fiber reinforced carbon (CFRC material) (roughness of the inner surface: 0.3 mm, average distance of concave and convex parts; 3 mm). Then, they were heated at about 2000° C. by arc discharge. After 5 minutes, synthetic quartz powders were gradually supplied for 10 minutes on the quartz glass layer with heating of arc discharge. Thereby, a composite crucible was obtained, in which the bubble-containing quartz glass layer having a thickness of about 3 mm on the inner side of the carbon outer layer and the transparent glass layer without bubble having a thickness of about 1.5 mm on the upper side are integrated in the carbon crucible.

After the quartz glass crucible was heated at about pulling up temperature of a silicon single crystal (about 1500° C.) for 24 hours, it was subjected to a cooling test 5 times. Thereby, any peeling off was not observed between the outer layer and the inner layer. Further, when monocrystalline silicon was pulled by using the composite crucible, almost all amount of the melt could be pulled in single crystallized form, and the quality of monocrystalline silicon was good up to tail, to obtain more superior results than in the case of conventional quartz glass crucible.

Example 2

Quartz powders were accumulated on an inner surface of a rotating carbon crucible made of carbon fiber reinforced carbon (gas permeability; 1.8 cm/sec, bulk specific gravity; 1.45) and heated at about 2,000° C. for 10 minutes by arc discharge from the surface side of the quartz powders, to melt the total layer contacted with the inner surface of the carbon crucible of the quartz powders and vitrify. Further, the pressure on the outer surface of the carbon crucible was decreased to 0.2 atm. and maintained for 5 minutes. After heating, the crucible was allowed to cool in still, to obtain a composite crucible (inner diameter; 580 mm) in which the outer layer (thickness: 5 mm) being made of carbon fiber reinforced carbon (CFRC material), the inner layer (thickness: 6 mm) being made of a transparent quartz glass, and both being integrated. A bubble content rate in an about 1 mm thickness inner surface side in the quartz glass layer was 0.01%.

After the quartz glass crucible was heated at about pulling up temperature of a silicon single crystal (about 1500° C.) for 24 hours, it was subjected to a cooling test by leaving at room temperature 5 times, by which any peeling off was not observed between the outer layer and the inner layer. Further, monocrystalline silicone silicon was pulled by using the composite crucible, almost all amount of the melt could be pulled in single crystallized forms, and the quality of monocrystalline silicon was good up to tail, to obtain more superior results than in the case of conventional quartz glass crucible.

Example 3

A composite crucible was prepared under similar conditions to Example 2 except that carbon fibers having gas permeability of 0.6 cm/sec, an average roughness of 0.5 mm and an average distance between concave and convex parts of 2 mm were used for a part contacted with the quartz glass of the inner layer as the carbon fibers of the outer layer. For the composite crucible, any glass was not peeled off from the fiber layer even though it was fallen from a height of 20 cm. Further, a single crystallization rate was higher than that of the conventional quartz glass crucible.

On the other hand, when a composite crucible was prepared similar to Example 2 except that carbon fibers having an average roughness of 0.01 mm and gas permeability of 0.4 cm/sec instead of the above-mentioned carbon fibers as a comparative sample, bubbles in the quartz glass layer was were not sucked sufficiently because of low gas permeability of carbon fibers, thus the bubbles were remained in the quartz glass layer. Therefore, a single crystallization rate was lower than in Example 2. Further, the quartz glass layer and the carbon fiber layer in the composite crucible were peeled off when it was fallen from a height of 20 cm.

Example 4

The total quartz glass layer in the inner layer was removed, by applying impact on the quartz glass crucible prepared in Example 2. By using the remaining carbon crucible, a quartz glass layer was formed under the similar conditions to Example 2, to regenerate the quartz glass crucible. As to the regenerated quartz glass crucible, the similar test to Example 2 was carried out, but any peeling off between the outer layer and the inner layer could not be observed.

Example 5

When monocrystalline silicon was pulled up from the crucible prepared in Example 2, the quartz glass layer on the inner circumference of the crucible was lost unevenly for about 0.2 mm–0.6 mm in a part contacted with melted silicon after used. Further, recrystallized cristobalite structures were observed partly. The inner surface of the crucible (the surface of the quartz glass layer) was heated at about 2,000° C. for 6 minutes by arc discharge, to regenerate the flat glass surface. When monocrystalline silicon was pulled up using the regenerated crucible, the single crystallization rate was equal to that in Example 2.

What is claimed is:

1. A method for preparing a composite crucible for pulling up monocrystalline silicone, the crucible comprising an outer layer made of a carbon fiber-reinforced carbonaceous material having fine gaps between fibers on an inner surface, the fibers having a gas permeability of 0.5 cm/sec or more, and wherein the crucible comprises an inner vitrified quartz layer which is integral with the outer layer through the fine gaps, the method comprising:

using a carbon fiber crucible as an outer circumferential part, supplying quartz powders on an inner surface of the carbon crucible while rotating it to be heated and malted; and vitrifying the quartz layer up to the inner surface of the carbon crucible to integrally form the quartz glass layer and the carbon crucible layer, thereby obtaining the composite crucible having a carbon fiber outer layer integrally formed with a quartz glass inner layer.

2. A method according to claim 1, comprising:

depositing quartz powders on the inner surface of the carbon crucible to be heated and melted; and supplying quartz powders gradually under boating to deposit a melted quartz powder on the quartz layer, thereby obtaining a composite crucible having a transparent glass layer formed in the inner surface thereof.

3. A method according to claim 1, comprising:

using a carbon fiber crucible having gas permeability as an outer circumferential part, depositing quartz powders on an inner surface of the carbon crucible while rotating it to be heated and fused;

reducing pressure in the carbon crucible through the carbon crucible upon the heating and fusing;

sucking and removing the gas contained in the quartz layer; and extruding bubbles contained in the quartz glass layer to form a transparent glass layer on an inner surface of the carbon crucible, thereby obtaining the composite crucible in which the quartz glass layer and the carbon crucible layer are integrally formed.

4. A method according to claim 1 for regenerating a composite crucible, comprising: heating the crucible from the inner surface side; and fusing again the surface of the quartz glass layer.

5. A method according to claim 1 for regenerating a composite crucible, comprising:

removing a quartz glass layer composite crucible;

supplying fresh quartz powders on an inner surface of the remaining carbon crucible to be heated and melted; and vitrifying the quartz powder to thereby integrally form the quartz glass layer and carbon crucible layer.

* * * * *

UNITED STATES PATENT AND TRADEMARK OFFICE
CERTIFICATE OF CORRECTION

PATENT NO. : 6,808,744 B2
APPLICATION NO. : 10/352654
DATED : October 26, 2004
INVENTOR(S) : Tsuji et al.

It is certified that error appears in the above-identified patent and that said Letters Patent is hereby corrected as shown below:

Column 1, Line 20, "from a composite" should read -- form a composite --

Column 5, Line 4, "about 2 ~ 40 mm" should read -- about 2 ~ 10 mm --

Column 7, Line 6, "silicone silicon was pulled" should read -- silicon was pulled --

Column 7, Lines 29-30, "was were not sucked" should read -- were not sucked --

Column 8, Line 6, "monocrystalline silicone" should read -- monocrystalline silicon --

Column 8, Line 27, "under boating" should read -- under heating --

Signed and Sealed this

Seventeenth Day of October, 2006

JON W. DUDAS
*Director of the United States Patent and Trademark Office*